(12) United States Patent
Baumgartner et al.

(10) Patent No.: US 7,489,220 B2
(45) Date of Patent: Feb. 10, 2009

(54) INTEGRATED CIRCUITS WITH INDUCTORS IN MULTIPLE CONDUCTIVE LAYERS

(75) Inventors: Peter Baumgartner, Munich (DE); Thomas Benetik, Munich (DE)

(73) Assignee: Infineon Technologies AG, Munich (DE)

( * ) Notice: Subject to any disclaimer, the term of this patent is extended or adjusted under 35 U.S.C. 154(b) by 114 days.

(21) Appl. No.: 11/156,743

(22) Filed: Jun. 20, 2005

(65) Prior Publication Data

US 2006/0284718 A1    Dec. 21, 2006

(51) Int. Cl.
*H01F 5/00*    (2006.01)
(52) U.S. Cl. .................................... 336/200
(58) Field of Classification Search .................. 336/200
See application file for complete search history.

(56) References Cited

U.S. PATENT DOCUMENTS

| | | | |
|---|---|---|---|
| 5,572,179 A | 11/1996 | Ito et al. | |
| 6,380,835 B1 | 4/2002 | Lee | |
| 6,759,937 B2 | 7/2004 | Kyriazidou | |
| 7,164,339 B2 * | 1/2007 | Huang | 336/200 |
| 2003/0071706 A1 | 4/2003 | Christensen | |
| 2005/0046501 A1 | 3/2005 | Moore | |
| 2005/0077992 A1 * | 4/2005 | Raghavan et al. | 336/200 |

FOREIGN PATENT DOCUMENTS

| | | |
|---|---|---|
| DE | 102 61 385 A1 | 7/2004 |
| WO | WO 2005/010900 A1 | 2/2005 |

OTHER PUBLICATIONS

Tiebout, M., "A Fully Integrated 1.3 GHz VCO for GSM in 0.25 μm Standard CMOS with a Phasenoise of -142dBc/Hz at 3MHz Offset," Proceedings 30th European Microwave Conference, Oct. 2000, 4 pages, Paris, France.
"Transformer," downloaded Jun. 15, 2005, 3 pages, http://hyperphysics.phy-astr.gsu.edu/hbase/magnetic/transf.html.

* cited by examiner

*Primary Examiner*—Elvin G Enad
*Assistant Examiner*—Joselito Baisa
(74) *Attorney, Agent, or Firm*—Slater & Matsil, L.L.P.

(57) ABSTRACT

Two inductors formed in multiple layers of conductive layers of integrated circuits are disclosed. Symmetric portions of a first inductor and a second inductor are formed in two or more conductive layers. Portions of the first inductor in adjacent conductive layers are connected by vias, and portions of the second inductor in adjacent conductive layers are connected by vias. The first and second inductor portions form a substantially loop-shaped structure in each conductive layer. The first and second inductor vias may be positioned at the same position within the substantially loop-shaped inductor structure by alternating inner and outer radiuses, or the vias for the second inductor may be positioned opposite the vias for the first inductor within the substantially loop-shaped inductor structure, using notches in the first and second inductor portions.

38 Claims, 12 Drawing Sheets

US 7,489,220 B2

INTEGRATED CIRCUITS WITH INDUCTORS IN MULTIPLE CONDUCTIVE LAYERS

TECHNICAL FIELD

The present invention relates generally to radio frequency (RF) integrated circuits (IC's), and more particularly to structures for inductors and methods of manufacturing thereof.

BACKGROUND

An inductor in electronics applications typically comprises a coil of wire that exhibits electromagnetic properties when current is run through the coil of wire. In general, an inductor can store energy in its magnetic field, and an inductor tends to resist a change in the amount of current flowing through it, for example. The inductance of an inductor is dependent upon several factors. One factor is the number of windings: the larger the number of windings, the higher the inductance. Another factor is the cross-sectional area of the coil: more area results in higher inductance. Another factor is the width of windings: a larger width results in a higher ratio of outer to inner diameter of the coil and reduced inductance. These factors also affect the parasitic capacitance and resistance of the inductor.

Inductors may be used singularly, or inductors may be used in pairs as differential inductors or transformers, as examples. In some semiconductor applications, such as RF IC's, inductors are manufactured on integrated circuits. It is desirable for circuits using on-chip (e.g., inductors manufactured on a semiconductor wafer or die) differential inductors to consume as little power as possible in order to extend battery life, for example, and for the differential inductors to produce as little noise as possible. Another important requirement for on-chip differential inductors is that they have low parasitic capacitance and that the inductance, capacitance, and resistance values of the pair of inductors are symmetric. On-chip inductors are significant components of RF IC's and are used in voltage controlled oscillators (VCO's), impedance matching networks, emitter degeneration circuits, and filters, as examples.

VCO's typically utilize differential inductors, which comprise two inductors coupled at one end to a common node or central tap. A VCO is an oscillator, wherein the control voltage controls the oscillator output frequency. Telecommunications systems such Bluetooth and GSM utilize VCO's in transceivers for controlling and switching channels, for example, for cell phone or wireless applications. Differential inductors with high inductivity, quality factor and low parasitic capacitance are needed for RF IC's such as VCO's in order to achieve low current and power consumption, low phase noise, and large tuning range for the frequency of the VCO.

FIG. 1 shows a prior art on-chip differential inductor in which all of the windings of two inductors are coplanar in one metallization layer. A single level differential inductor of this type is utilized in a VCO design described in a paper by Tiebout entitled, "A Fully Integrated 1.3 GHz VCO for GSM in 0.25 µm Standard CMOS with a Phasenoise of −142 dBc/Hz at 3 MHz Offset," published in Proceedings 30th European Microwave Conference, Paris, October, 2000, which paper is incorporated herein by reference. In particular, see FIG. 5 of the Tiebout paper, which shows a similar design of a differential inductor as is shown in FIG. 1 of the present patent application.

In the single layer differential inductor shown in FIG. 1, a second metallization level is used for the under-crossings, which are necessary to increase the symmetry of the differential inductor. The inductor is designed for a low parasitic capacitance of the two differential inputs at terminals A and B. The inductor includes two partial inductors: inductor $L_A$, which comprises a partial inductor disposed between terminal A and middle tap D, and inductor $L_B$, which comprises a partial inductor disposed between B and the middle tap D. The partial inductors $L_A$ and $L_A$ are close to being symmetric and have a high coupling ratio. The middle tap D is typically coupled with a supply voltage ($V_{DD}$). A prior art VCO circuit that the differential inductor shown in FIG. 1 may be used in is shown in FIG. 2, for example.

In the differential inductor design shown in FIG. 1, the difference of the diameter of the inner and outer windings of inductors $L_A$ and $L_B$ leads to a reduced coupling factor of the windings and to a reduced achievable inductivity. The ratio of resistivity to inductivity, which is responsible for the quality factor (Q factor), is therefore degraded. The Q factor is a measure of an inductor's performance characteristics and has strong influence on the performance of the RF circuit, such as power consumption and noise, for example. It is desirable to build on-chip differential inductors with high inductance, high Q factor, low capacitance and high symmetry using only a small footprint.

U.S. Pat. No. 6,759,937 B2 issued to Kyriazidou, entitled "On-chip Differential Multi-Layer Inductor," which is incorporated herein by reference, discloses a differential inductor that is formed in two metal layers. The use of additional metal layers for shunting additional windings in parallel to the inductor windings is also disclosed. However, this differential inductor design does not achieve perfect symmetry, because the connection structure that is used to connect the partial inductors introduces an asymmetry.

In particular, in the prior art differential inductor formed in a single metallization layer shown in FIG. 1, and also with the prior art differential inductor formed in two metal layers as described in U.S. Pat. No. 6,759,937, there is a lack of symmetry due to the cross-overs of the inductors. For example, the underpasses where the windings cross each other add resistance and capacitance to one winding but not to the other. This offset is typically reduced in prior art designs by alternating the underpasses. However, the location within the inductor is unsymmetrical, e.g., one half inductor has its underpasses nearer to the middle pin or center tap, and the other one nearer to the A or B voltage input. It is desirable for the two inductors of a differential inductor to have the same value of inductance and for the windings to be symmetric regarding the resistance and capacitance (e.g., to the substrate or to other inductor windings).

Thus, what are needed in the art are improved differential inductor designs in integrated circuits.

SUMMARY OF THE INVENTION

These and other problems are generally solved or circumvented, and technical advantages are generally achieved, by preferred embodiments of the present invention, which provide novel structures for two inductors that may be implemented in two or more conductive layers of an integrated circuit. In some embodiments, connections may be made to one or more conductive layers by alternating the location of the via connections to the portions of the two inductors in the various conductive layers at locations at an inner and outer radius of the inductor portions, allowing the manufacture of differential inductors having increased inductance. In other embodiments, the via connections are located at the same position within a substantially loop-shaped structure of the two inductors, and a notch is included at each end of the inductor portions to accommodate the vias.

In accordance with a preferred embodiment of the present invention, a semiconductor device includes a workpiece, and a first conductive layer disposed over the workpiece. A first portion of a first inductor and a first portion of a second inductor are disposed within the first conductive layer, the first portion of the second inductor being symmetric to the first portion of the first inductor. At least one second conductive layer is disposed proximate the first conductive layer, a second portion of the first inductor and a second portion of the second inductor being disposed within each at least one second conductive layer. Each second portion of the second inductor is symmetric to each second portion of the first inductor within each at least one second conductive layer. At least one first inductor via couples the first portion of the first inductor in the first conductive layer to the second portion of the first inductor in an adjacent second conductive layer. At least one second inductor via couples the first portion of the second inductor in the first conductive layer to the second portion of the second inductor in the adjacent second conductive layer. The at least one second inductor via is symmetric to the at least one first inductor via.

In accordance with another preferred embodiment of the present invention, a method of manufacturing a semiconductor device includes providing a workpiece, forming a first conductive layer over the workpiece, and forming at least one second conductive layer proximate the first conductive layer. A first portion of a first inductor and a first portion of a second inductor are formed within the first conductive layer, the first portion of the first inductor and the first portion of the second inductor being symmetric. A second portion of the first inductor and a second portion of the second inductor are formed within each at least one second conductive layer. Each second portion of the first inductor and each second portion of the second inductor are symmetric within each at least one second conductive layer. The first portion of the first inductor in the first conductive layer is coupled to the second portion of the first inductor in an adjacent second conductive layer with at least one first inductor via. The first portion of the second inductor in the first conductive layer is coupled to the second portion of the second inductor with at least one second inductor via in the adjacent second conductive layer. The at least one first inductor via and the at least one second inductor via are symmetric.

Advantages of preferred embodiments of the present invention include providing pairs of coupled inductors wherein the two inductors have very symmetric inductance, resistance, and capacitance values. Differential inductors with increased inductance may be achieved by utilizing a greater number of conductive layers of integrated circuits, and by increasing the number of windings of the portions of the inductors within one or more conductive layers. Asymmetry of the two inductors is minimized by via positioning, using appropriate layouts, and by the use of notches at the end of the inductor portions for accommodating the via positioning to achieve increased symmetry.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which:

FIGS. 6A through 6C show top views of an embodiment of the present invention, wherein the portions of the first and second inductors comprise half-windings, wherein the ends of the portions of the first and second inductors are notched to accommodate the vias, creating a symmetric structure, and wherein the voltage connections are made within the same conductive layer that the top and bottom portions of the first and second inductors are formed in;

FIG. 18 shows a transformer that the novel first inductors and second inductors of embodiments of the present invention described herein may be implemented in.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely differential inductors used in a VCO circuit. Embodiments of the invention may also be applied, however, to other RF designs requiring the use of inductors, for example, such as transformers and other circuits or circuit components requiring two coupled inductors.

Figure 3:
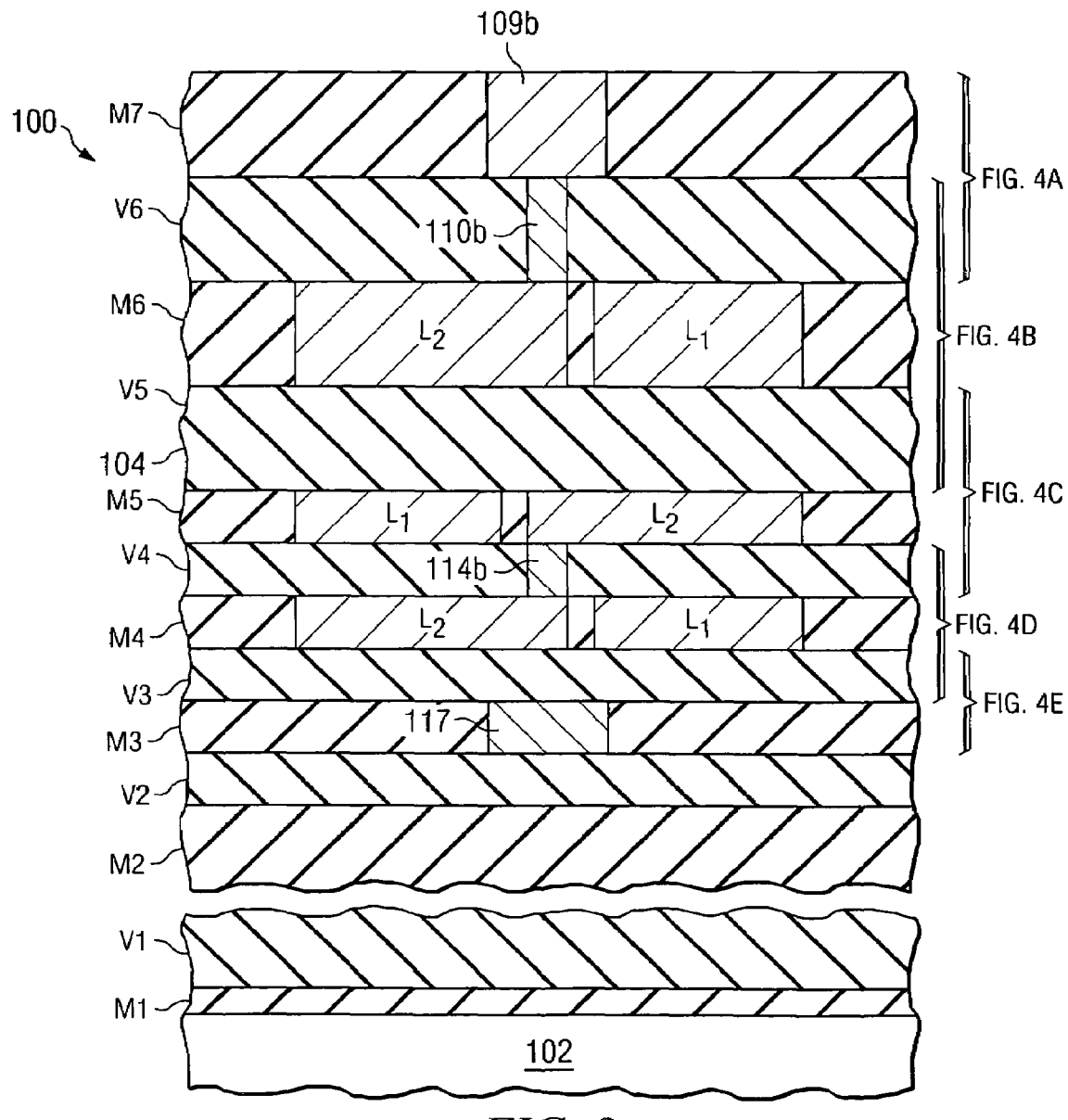
FIG. 3 is a cross-sectional view of a preferred embodiment of the present invention, wherein a differential inductor is formed in multiple conductive layers of an integrated circuit.

FIG. 3 is a cross-sectional view of an embodiment of the present invention, wherein a semiconductor device 100 includes a differential inductor formed in multiple conductive layers M1, M2, M3, M4, M5, M6, M7, V1, V2, V3, V4, V5, and V6 of an integrated circuit. The conductive layers M1, M2, M3, M4, M5, M6, M7, V1, V2, V3, V4, V5, and V6 may comprise metallization layers M1, M2, M3, M4, M5, M6, and M7 and via metallization layers V1, V2, V3, V4, V5, and V6 that comprise aluminum, copper, tungsten, other metals, or combinations or alloys thereof, for example. The metallization layers M1, M2, M3, M4, M5, M6, M7, V1, V2, V3, V4, V5, and V6 typically comprise interconnect layers formed in later stages of the manufacturing process for the semiconductor device 100, often referred to as the back end of the line (BEOL), for example, after active areas are formed in a workpiece 102. The top-most conductive layers M6, M7, V5, and V6 may comprise an increased thickness, compared to the underlying conductive layers M1 through M5 and V1 through V4, for example. Seven metallization layers and six via layers are shown in FIG. 3; alternatively, there may be more, or fewer, conductive layers included in a semiconductor device 100 in accordance with embodiments of the present invention, for example.

Alternatively, the differential inductors to be described herein may be formed in other conductive material layers of a semiconductor device, comprising semiconductive materials such as silicon, or silicon combined with other materials such as metals, for example.

To manufacture the semiconductor device 100, first, a workpiece 102 is provided. The workpiece 102 may include a semiconductor substrate comprising silicon or other semiconductor materials covered by an insulating layer, for example. The workpiece 102 may also include other active components or circuits formed in the front end of line (FEOL), not shown. The workpiece 102 may comprise silicon oxide over single-crystal silicon, for example. The workpiece 102 may include other conductive layers or other semiconductor elements, e.g., transistors, diodes, etc. Compound semiconductors, GaAs, InP, Si/Ge, or SiC, as examples, may be used in place of silicon.

Next, a conductive layer such as M1 is formed over the workpiece 102. The conductive layer may be formed using a subtractive etch process, wherein conductive material is deposited over the workpiece 102 and then patterned. An insulating material 104 is then deposited between the patterned conductive material. Alternatively, the insulating material 104 may be deposited first, and the insulating material 104 is then patterned and filled in with a conductive material, referred to in the art as a damascene process.

A similar process may be used to form multiple layers of interconnect M2, M3, M4, M5, M6, M7, and V1, V2, V3, V4, V5, and V6 sequentially over the conductive layer M1, as shown. The conductive material in two or more interconnect layers M1, M2, M3, M4, M5, M6, and M7 forms portions of inductors $L_1$ and $L_2$, in accordance with embodiments of the present invention. Conductive lines may also be formed in other regions of the semiconductor device 100 in the interconnect layers M1, M2, M3, M4, M5, M6, and M7, for example, (not shown). The via levels V1, V2, V3, V4, V5, and V6 provide electrical connection between adjacent conductive layers M1, M2, M3, M4, M5, M6, and M7, for example, and are also used to connect the portions of the inductors $L_1$ and $L_2$ in adjacent conductive material layers, in accordance with embodiments of the present invention. A via level such as V2 and an overlying interconnect layer such as M3 may be formed in a dual damascene process, for example.

Preferably, in accordance with preferred embodiments of the present invention, portions of a differential inductor $L_1$ and $L_2$ are formed in two or more conductive layers M1 through M7, and the portions of each of the inductors $L_1$ and $L_2$ are connected together using the via levels V1 through V6, to be described further herein.

Top views of conductive layers of the novel differential inductor in accordance with an embodiment of the present invention are shown in FIGS. 4A, 4B, 4C, 4D, and 4E. In the embodiment shown in FIGS. 4A, 4B, 4C, 4D, and 4E, each portion of the first and second inductors $L_1$ and $L_2$ of the differential inductor within a single conductive layer comprises one full winding, although in other embodiments, the portions of the first and second inductors $L_1$ and $L_2$ may comprise other numbers of windings (2, 3, 4, etc.), fractional portions of windings, or fractional portions of greater than full windings, for example, to be described further herein.

Figure 4B:
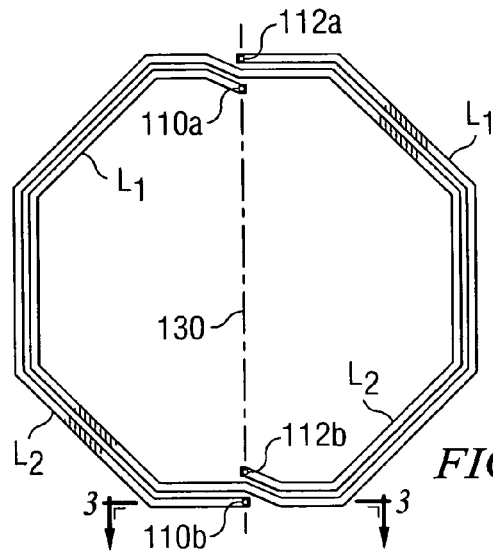
FIG. 4B shows a top view of a conductive layer disposed beneath the upper conductive layer, wherein a first portion of a first inductor and a first portion of a second inductor are formed within the conductive layer, the first portions of the first and second inductors each comprising one full winding, and wherein the voltage terminals are coupled to the first portions of the first and second inductors by vias at opposing sides of the structure.
Figure 4A:
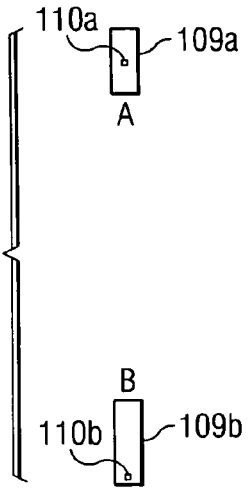
FIG. 4A is a top view of an upper conductive layer of the embodiment shown in FIG. 3, wherein voltage terminal connections are formed in the upper conductive layer.

FIG. 4A is a top view of an upper conductive layer such as layer M7 shown in FIG. 3, wherein voltage terminal connections 109a and 109b are formed in the upper conductive layer M7. A cross-sectional view of a portion of FIG. 4A labeled by arrows 3-3 is shown in FIG. 3. The voltage terminal connections 109a and 109b may be coupled to voltage terminals A and B, respectively, of a VCO circuit such as the one shown in FIG. 2, for example.

FIG. 4B shows a top view of a conductive layer such as M6 of FIG. 3 disposed beneath the upper conductive layer M7, wherein a first portion of a first inductor $L_1$ and a first portion of a second inductor $L_2$ are formed within the conductive layer M6. A cross-sectional view of a portion of FIG. 4B labeled by arrows 3-3 is shown in FIG. 3. The first portions of the first and second inductors $L_1$ and $L_2$ each comprise a full winding and are symmetric, as can be seen in FIG. 4B. Preferably, the voltage terminal connections 109a and 109b are coupled by vias 110a and 110b to ends of the first portions of the first and second inductors $L_1$ and $L_2$, respectively, at opposing sides of the structure, as shown. For example, the first portions of the first and second inductors $L_1$ and $L_2$ preferably comprise a substantially loop-shaped or circular structure, and via 110b is preferably positioned about 180 degrees from via 110a in the substantially loop-shaped structure. In other words, via 110b is preferably positioned opposite from via 110a in the substantially loop-shaped structure, for example.

Preferably, the ends of the first portion of the first inductor $L_1$ are staggered and overlap across a vertical axis 130, proximate vias 110a and 112a that provide connection to adjacent conductive materials layers. Likewise, the ends of the first portion of the second inductor $L_2$ are staggered and overlap across the vertical axis 130, proximate vias 110b and 112b that provide connection to adjacent conductive materials layers. In particular, in some embodiments, the first inductor vias and the second inductors are aligned on a straight line. For example, in FIG. 4B, vias 110a and 110b, and vias 112a and 112b, are aligned on a straight line, e.g., axis 130.

The vias 110a, 110b, 112a and 112b, are preferably centered on the vertical axis 130, as shown. Also, preferably, one via 110a for making a connection to the voltage terminal connection 109a (e.g., to voltage terminal A in the VCO circuit shown in FIG. 2) is positioned at an inner side of the substantially loop-shaped structure, and the other via 110b for making a connection to the voltage terminal connection 109b (e.g., to voltage terminal B shown in FIG. 2) is positioned at an outer side of the substantially loop-shaped structure, to improve the symmetry of the structure of the differential inductor.

Figure 4C:
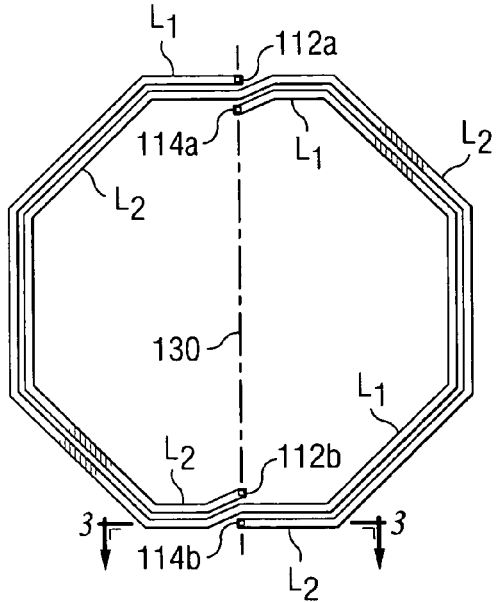
FIG. 4C shows a top view of a conductive layer disposed beneath the conductive layer shown in FIG. 4B, with a second portion of the first inductor and a second portion of the second inductor being formed therein.

FIG. 4C shows a top view of a conductive layer such as layer M5 of FIG. 3 disposed beneath the conductive layer shown in FIG. 4B, with a second portion of the first inductor $L_1$ and a second portion of the second inductor $L_2$ being formed therein. The second portions of the first and second inductors $L_1$ and $L_2$ each comprise a full winding and are symmetric within the conductive layer M5 they are formed in. The vias 112a and 114a that couple the ends of the second portion of the first inductor $L_1$ to adjacent conductive layers are preferably located proximate one another. The vias 112b and 114b that couple the ends of the second portion of the second inductor $L_2$ to adjacent conductive layers are preferably located proximate one another, and are preferably located opposite vias 112a and 114a in the substantially loop-shaped structure of the first and second inductor $L_1$ and $L_2$ second portions.

Top outer via 112a is formed in via layer V5 disposed above conductive layer M5 and couples one end of the first portion of the first inductor $L_1$ in conductive layer M6 to an end of the second portion of the first inductor $L_1$ in conductive layer M5. Top inner via 114a is formed in via layer V4 disposed below conductive layer M5 and couples the other end of the second portion of the first inductor $L_1$ in conductive layer M5 to an end of a third portion of the first inductor $L_1$ in conductive layer M4, shown in FIG. 4D. Likewise, bottom inner via 112b is formed in via layer V5 disposed above conductive layer M5 and couples one end of the first portion of the second inductor $L_2$ in conductive layer M6 to an end of the second portion of the second inductor $L_2$ in conductive layer M5. Bottom outer via 114b is formed in via layer V4 disposed below conductive layer M5 and couples the other end of the second portion of the second inductor $L_2$ in conductive layer M5 to an end of a third portion of the second inductor $L_2$ in conductive layer M4, shown in FIG. 4D.

Figure 4D:
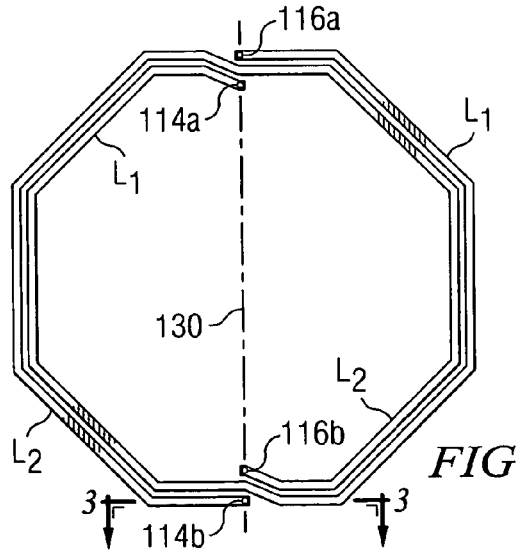
FIG. 4D shows a top view of a conductive layer disposed beneath the layer shown in FIG. 4C, with a third portion of the first inductor and a third portion of the second inductor being formed therein.

FIG. 4D shows a top view of a conductive layer such as layer M4 disposed beneath the layer M5 shown in FIG. 4C, with a third portion of the first inductor $L_1$ and a third portion of the second inductor $L_2$ being formed therein and connected as described above to the second portions of the first and second inductors $L_1$ and $L_2$ as described above. The third portions of the first and second inductors $L_1$ and $L_2$ each comprise a full winding and are symmetric within the conductive layer M4 they are formed in. The vias 114a and 116a that couple the ends of the third portion of the first inductor $L_1$ to adjacent conductive layers are preferably located proximate one another. The vias and 114b and 116b that couple the ends of the third portion of the second inductor $L_2$ to adjacent conductive layers are preferably located proximate one another, and are preferably located opposite the vias 114a and 114b in the substantially loop-shaped structure of the first and second inductor $L_1$ and $L_2$ third portions.

Top outer via 116a is preferably coupled between an end of the third portion of the first inductor $L_1$ to an end of a conductive line 117 in an adjacent conductive layer such as layer M3 shown in FIG. 3. The top inner via 114a couples the other end of the third portion of the first inductor $L_1$ to an end of the second portion of the first inductor $L_1$ of FIG. 4C. Likewise, bottom inner via 116b is coupled between an end of the third portion of the second inductor $L_2$ to an end of a conductive line 117 in the conductive layer M3. The bottom outer via 114b couples the other end of the third portion of the second inductor $L_2$ to an end of the second portion of the second inductor $L_2$ of FIG. 4C.

Figure 1:
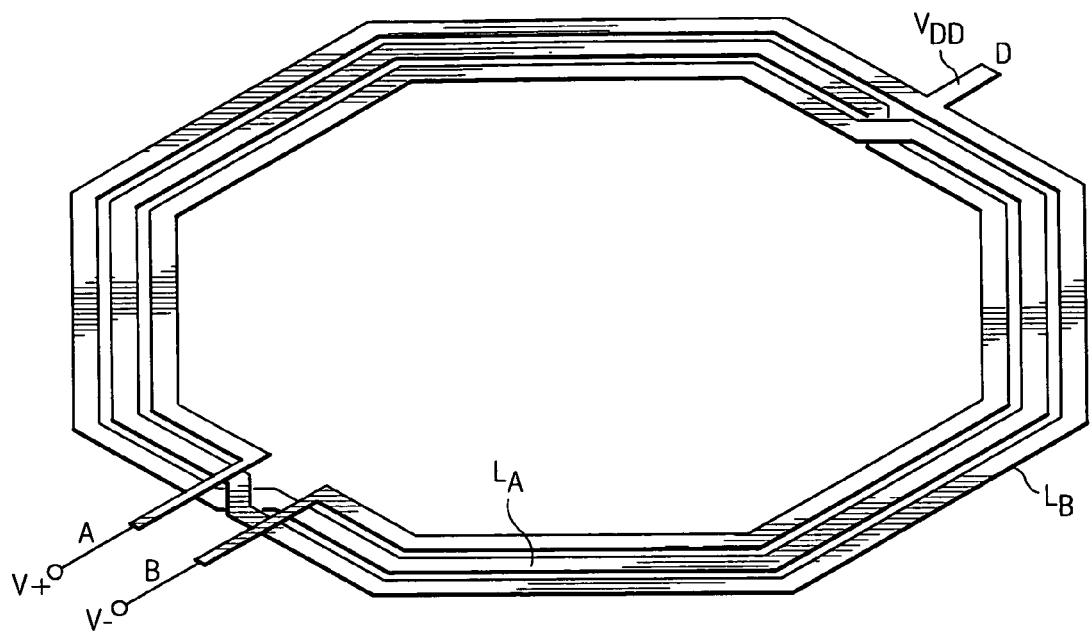
FIG. 1 is a prior art drawing of a differential inductor formed in a metallization layer of an integrated circuit.
Figure 2:
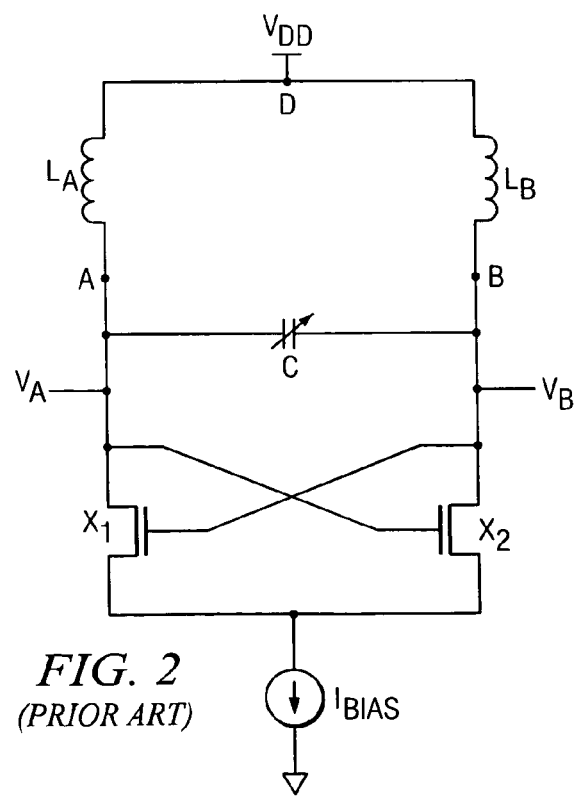
FIG. 2 is a schematic of a prior art VCO circuit that utilizes a differential inductor.
Figure 4E:
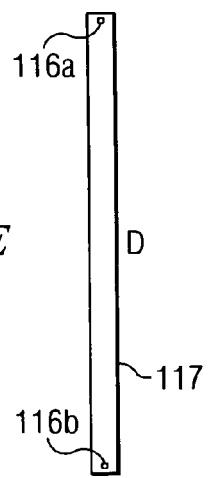
FIG. 4E shows a top view of a conductive layer of the differential inductor disposed beneath the layer shown in FIG. 4D, wherein a portion of the conductive layer is used to connect the third portion of the first inductor to the third portion of the second inductor and to a voltage supply.
Figure 5B:
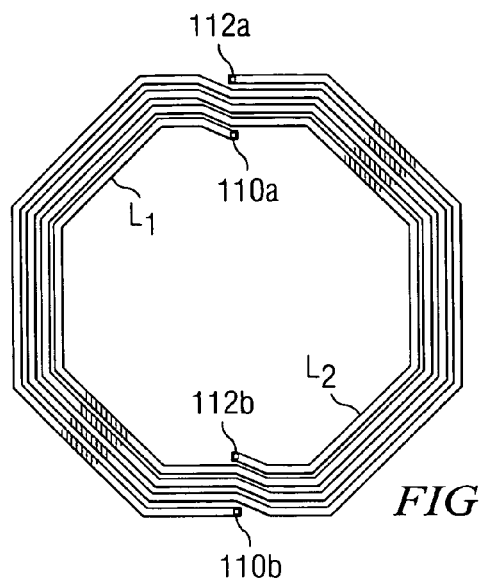
FIGS. 5A through 5E show top views of another embodiment of the present invention, wherein the portions of the first inductor and the second inductor in each conductive layer comprise two full windings.
Figure 5A:
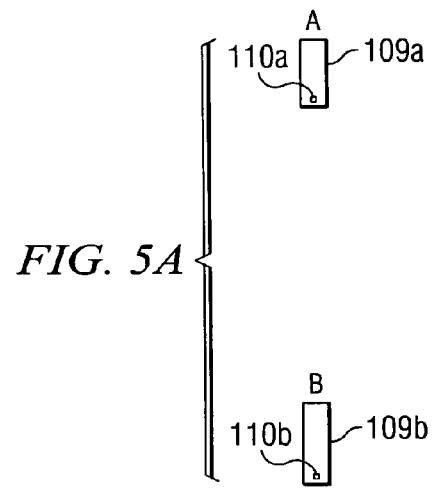
Figure 5C:
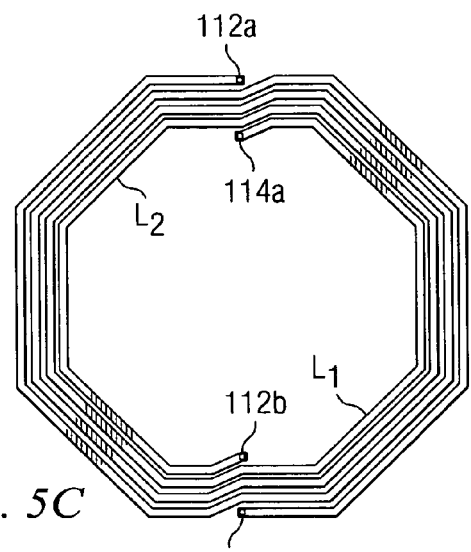
Figure 5D:
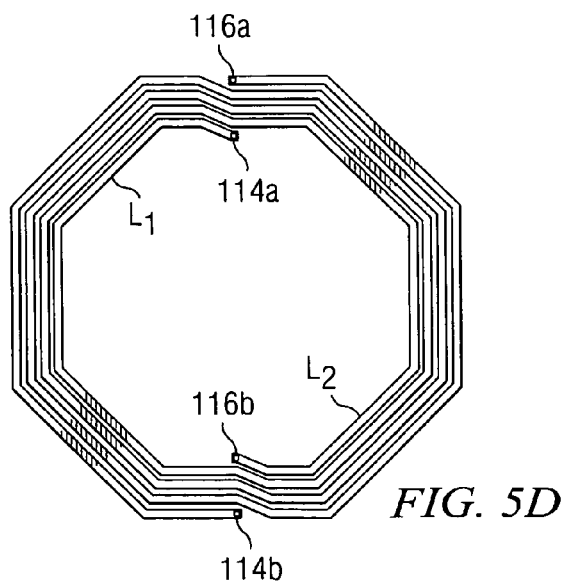
Figure 5E:
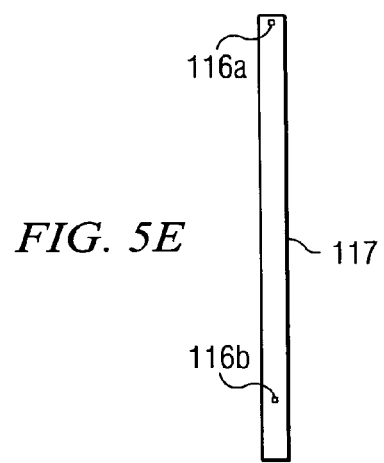

FIG. 4E shows a top view of a conductive layer of the differential inductor disposed beneath the layer shown in FIG. 4D, wherein a portion of the conductive layer is used to connect the third portion of the first inductor $L_1$ and the third portion of the second inductor $L_2$ together and to a voltage supply VDD, as shown in the schematic of FIG. 2. The conductive line 117 may be coupled to voltage terminal D elsewhere in the conductive layer M3, for example, not shown. For example, the conductive line 117 may be electrically connected to a middle tap or a voltage supply terminal $V_{DD}$, as shown in the VCO circuit of FIG. 2, for example. The inductors $L_1$ and $L_2$ described in the embodiments herein may be used to replace the inductors $L_A$ and $L_B$ shown in FIG. 2, for example.

In each of the conductive layers, by alternating the via connection positions, e.g., using a top outer via 112a and bottom inner via 114a for the second portion of the first inductor $L_1$, as shown in FIG. 4C, and using a bottom inner via 112b and bottom outer via 114b for the second portion of the second inductor $L_2$, improved symmetry of the differential inductor is achieved.

In this embodiment, windings of inductors $L_1$ and $L_2$ are shown formed in three conductive layers. Alternatively, only two conductive layers may be used (as shown in FIGS. 4B and 4C) and coupled to a conductive line 117 as shown in FIG. 4E beneath the lowest conductive layer. Furthermore, additional windings or portions of the inductors $L_1$ and $L_2$ may be formed in 4 or more conductive layers, again, with a conductive line 117 being used in a lower conductive layer to connect the inductors $L_1$ and $L_2$.

The portions of the inductors $L_1$ and $L_2$ in the embodiment shown in FIGS. 4B through 4D comprise full windings; alternatively, the number of windings may vary between layer to layer. If the number of windings varies, preferably, the number of windings comprise whole numbers, e.g., 1, 2, 3, 4, etc., so that the via positions will line up from layer to layer, for example.

Because the portions of the first and second inductors $L_1$ and $L_2$ are symmetric in each layer, the layout of the portions may be designed by rotation and/or a mirror operation of one of the portions, for example. A first pattern for a portion of a first inductor $L_1$ may be designed, and to generate the pattern for a portion of a second inductor $L_2$ within the same conductive layer, the first pattern may be rotated by 180 degrees to generate a second pattern for the portion of the second inductor $L_2$, for example.

Figure 16:
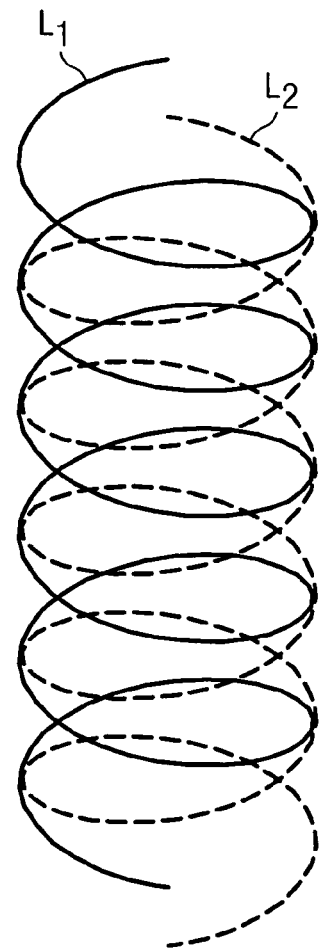
FIG. 16 illustrates a diagram for an ideal double-spherical shaped differential inductor or transformer that may be manufactured in multiple conductive layers in accordance with embodiments of the present invention.

In this embodiment, in a perspective view, the first inductor $L_1$ comprises a substantially spiral shape within conductive layer M6 (FIG. 4B), conductive layer M5 (FIG. 4C), and conductive layer M4 (FIG. 4D). Likewise, the second inductor $L_2$ comprises a spiral shape within conductive layer M6 (FIG. 4B), conductive layer M5 (FIG. 4C), and conductive layer M4 (FIG. 4D). Thus, a structure close to an ideal differential structure such as the one shown in FIG. 16 is achievable by embodiments of the present invention. A pair of coupled inductors $L_1$ and $L_2$ is created, wherein the second inductor $L_2$ comprises a mirror image of the first inductor $L_1$ and is symmetrical to the first inductor $L_1$.

FIGS. 5A through 5E show top views of another embodiment of the present invention, wherein the portions of the first inductor $L_1$ and the second inductor $L_2$ in each conductive layer comprise two full windings. The structure is similar to the structure shown in FIGS. 4A through 4E, with the difference being that the each portion of the first and second inductors $L_1$ and $L_2$ comprises two loops or windings.

Each portion of the second inductor $L_2$ in each conductive layer preferably comprises a symmetric mirror image, generated by rotation and/or a mirror operation, of the first portion of the first inductor $L_1$ in that conductive layer. Also, preferably, as in the embodiment of the present invention shown in FIGS. 4A through 4E, the voltage terminals A and B are located at opposing sides of the structure, as shown, with one terminal at the outer diameter and one at the inner diameter to preserve the correct winding direction and to achieve symmetry. This is advantageous because one connection to an underlying inductor portion may be made at each end proximate the voltage terminals A and B. A via 110a may be coupled to an end of the first inductor $L_1$ proximate the connection of voltage terminal A to the first portion of inductor $L_1$, and a via 110b may be coupled to an end of the second inductor $L_2$ proximate the connection of voltage terminal B to the first portion of inductor $L_1$. This is advantageous because a very symmetric structure, e.g., physically, electrically, and electromagnetically, is created, wherein the first inductor $L_1$ portion and the second inductor $L_2$ portion comprise the same size and shape, and wherein the vias 110a and 110b are both located proximate a voltage terminal A and B, respectively.

Note that each via 110a and 110b may comprise a single via or conductive plug formed in a via layer such as layers V1 through V6 shown in FIG. 3, or each via 110a and 110b may comprise a plurality of vias, for example.

In particular, in this embodiment, the first portion of the first inductor $L_1$ comprises two windings, and the first portion of the second inductor $L_2$ comprises two windings. Because the number of windings is increased in each layer, the inductance of the inductors $L_1$ and $L_2$ is advantageously increased. The two windings the first inductor $L_1$ portion and the second inductor $L_2$ portion in each conductive layer comprise a substantially loop-shaped structure, and voltage terminal B is positioned within the substantially loop-shaped structure on an opposing side from voltage terminal A. Preferably, voltage terminal B is positioned about 180 degrees within the substantially loop-shaped structure relative to voltage terminal A in the substantially loop-shaped structure. One voltage terminal is placed at the outer diameter, while the other voltage terminal is placed at the inner diameter. This remaining asymmetry can be reduced by the layout of the connecting structure, which contacts the voltage terminals using the vias, for example.

Preferably, in the embodiments shown in FIGS. 4A through 4E and 5A through 5E, the ends of the portions of the first inductor $L_1$ in each conductive layer are staggered and overlap across an axis, proximate the vias that provide connection to adjacent conductive materials layers. Likewise, the ends of the portions of the second inductor $L_2$ in each conductive layer are staggered and overlap across an axis proximate the vias that provide connection to adjacent conductive materials layers. The vias are preferably centered on the axis, and the vias for the first inductor $L_1$ are preferably positioned opposite from the second inductor $L_2$ vias within the substantially loop-shaped structure formed by the inductor portions in each conductive layer. Connections between inductor portions are made using inner and outer vias to improve the symmetry of the structure of the coupled inductors $L_1$ and $L_2$.

Note also that in the embodiments shown in FIGS. 4A through 4E and FIGS. 5A through 5E, the second portion of the first inductor $L_1$ is disposed within the second conductive layer proximate the first portion of the second inductor $L_2$ in the first conductive layer, and the second portion of the second inductor $L_2$ is disposed within the second conductive layer proximate the first portion of the first inductor $L_1$ in the first conductive layer. For example, the second portion of the first inductor $L_1$ may be disposed immediately beneath the first portion of the second inductor $L_2$ in an adjacent conductive layer.

Figure 6A:
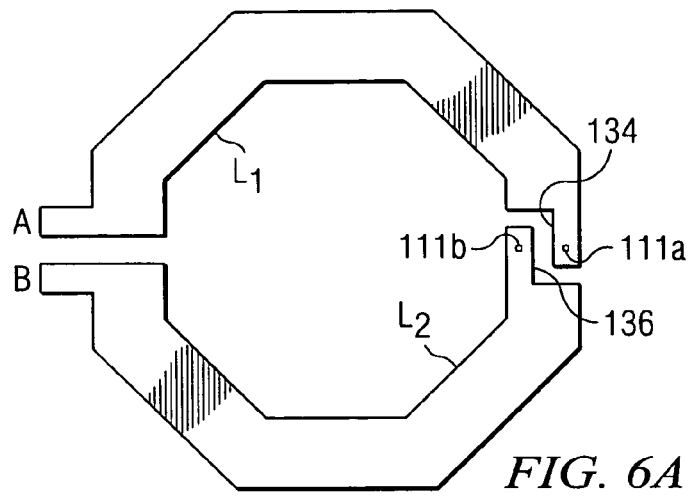
Figure 6B:
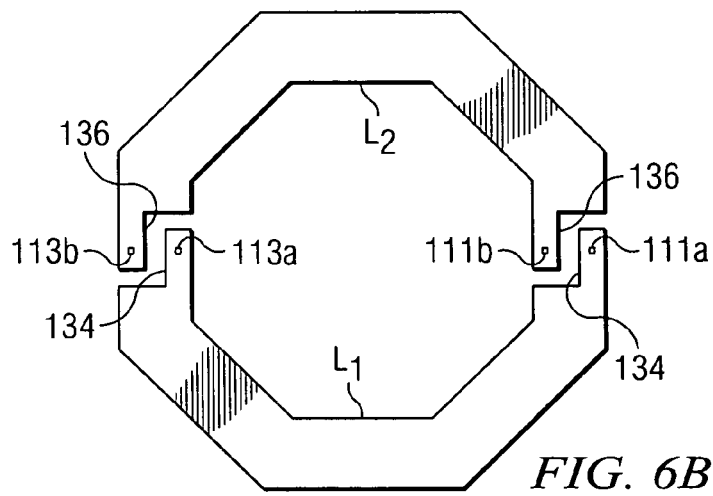
Figure 6C:
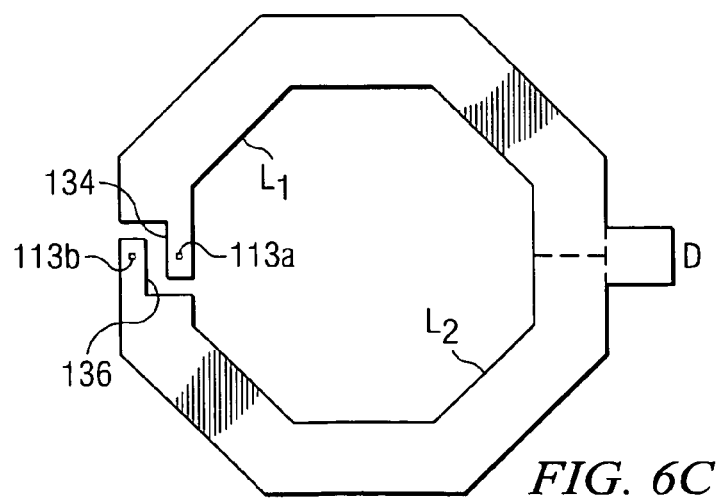

FIGS. 6A through 6C show top views of an embodiment of the present invention, wherein the portions of the first and second inductors $L_1$ and $L_2$ in each conductive layer comprise half-windings. In this embodiment, the ends of the portions of the first and second inductors are notched to accommodate the connecting vias, creating a symmetric structure. The voltage connections are made within the same conductive layer that the top and bottom portions of the first and second inductors are formed in, so that the structure is formed using only three conductive layers (and two via layers between the conductive layers).

Referring to FIG. 6A, the connections for the first inductor $L_1$ will next be described. One end of a first portion of the first inductor $L_1$ is coupled to a voltage terminal A. The first portion of the first inductor $L_1$ comprises a half-winding with the other end comprising a notch 134. The notch 134 shown is an inwardly-facing notch, facing inside the substantially loop-shaped structure formed by the inductor $L_1$ and $L_2$ portions. A via 111a formed in an adjacent via layer couples the first portion of the first inductor $L_1$ to a second portion of the first inductor $L_1$ shown in FIG. 6B. The second portion of the first inductor $L_1$ also comprises an inwardly-facing notch 134 formed at the end proximate the via 111a, as shown. The second portion of the first inductor $L_1$ comprises a half-winding with another end comprising a notch 134. The left-most notch 134 proximate via 113a in FIG. 6B comprises an outwardly-pointing notch, for example. A via 113a formed in a via layer couples the second portion of the first inductor $L_1$ to a third portion of the first inductor $L_1$ formed in an adjacent conductive layer, as shown in FIG. 6C. The third portion of the first inductor $L_1$ comprises a half winding that is coupled to the end of a third portion of the second inductor $L_2$, and also to a voltage supply terminal D, as shown.

Thus, the first inductor $L_1$ shape comprises an S shape or spiral within the conductive layers that the first inductor $L_1$ is formed in. In a top view, the first inductor $L_1$ shape comprises a circular shape within the top-most conductive layer and the adjacent conductive layer, for example.

The portions of the second inductor $L_2$ are symmetric to the first inductor $L_1$ portions within each conductive layer. The portions of the second inductor $L_2$ comprise a notch 136 at the ends thereof, wherein the second inductor $L_2$ notch 136 fits with the notch 134 of the first inductor $L_1$ so that the connecting vias 111a, 111b, 113a, and 113b are centered along a central axis to the substantially loop-shaped structure, thus allowing a symmetric connection structure for the inductors $L_1$ and $L_2$.

The ends of the portions of the first inductor $L_1$ and the second inductor $L_2$ preferably include the notch 134 and 136, respectively, so that the adjacent ends of the first inductor $L_1$ portion and the second inductor $L_2$ portion may be staggered, as shown. For example, in FIG. 6B, via 111b is coupled at a location at an inner radius of the second portion of the first inductor $L_1$ and at a location at an inner radius of the first portion of the first inductor $L_1$ (see FIG. 6A), and via 111a is coupled at a location at an outer radius of the second portion of the second inductor $L_2$ (FIG. 6B) and at a location at an outer radius of the first portion of the second inductor $L_2$ (FIG. 6A). The vias 111a and 111b are preferably coupled at the notched ends of the portions of the first inductor $L_1$ and the portions of the second inductor $L_2$, as shown.

Figure 7A:
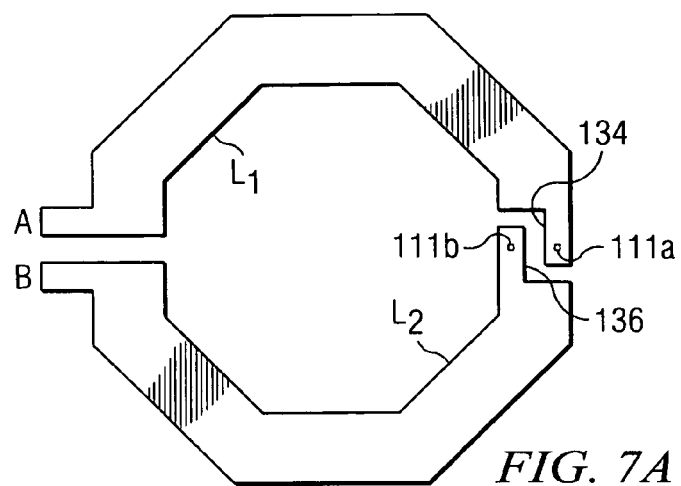
FIGS. 7A through 7C show an embodiment of the invention similar to the embodiment shown in FIGS. 6A through 6C, wherein the portions of the first inductor and the second inductor formed in the middle conductive layer (FIG. 7B) comprise 1.5 windings.
Figure 7B:
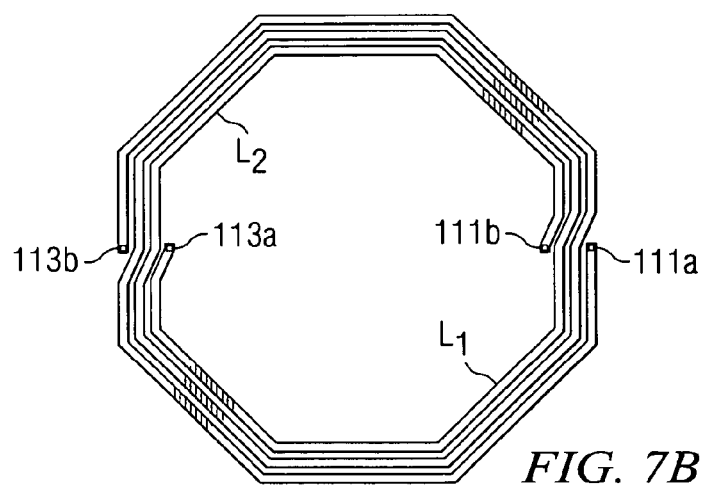
Figure 7C:
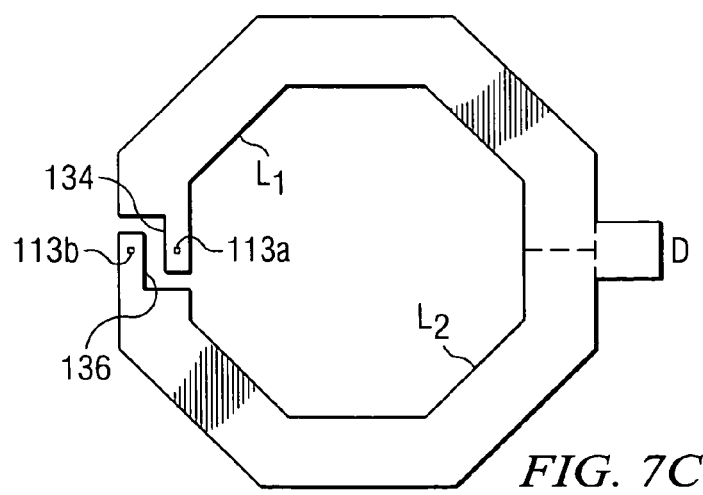

FIGS. 7A through 7C show an embodiment of the invention similar to the embodiment shown in FIGS. 6A through 6C, wherein the portions' of the first inductor $L_1$ and the second inductor $L_2$ formed in the middle conductive layer (FIG. 7B) comprise 1.5 windings. This embodiment is advantageous because the inductance of the inductors $L_1$ and $L_2$ is increased, because of the increased number of windings. Note that if a fractional number of windings are used, preferably the same fraction of a winding is used for all of the portions of the inductors $L_1$ and $L_2$ in some embodiments, so that vias 111a, 111b, 113a, and 113b will line up and thus make electrical connection between the conductive layers. For example, the middle conductive layer shown in FIG. 7B may alternatively comprise 2.5 windings, 3.5 windings, or x.5 windings, wherein x is a whole number.

In accordance with some embodiments of the present invention, for example, the portions of the first inductor $L_1$ and the portions of the second inductor $L_2$ within a conductive layer comprise x.f windings, wherein x comprises a whole number such as 0, 1, 2, 3, etc. and wherein f comprises a fraction of a winding.

Figure 8A:
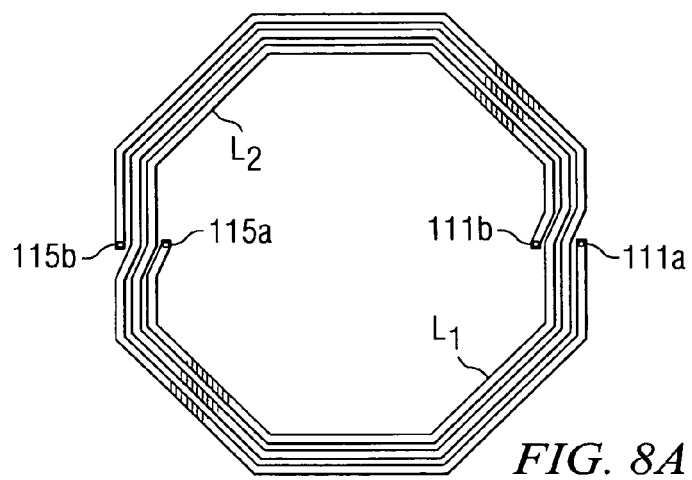
FIGS. 8A, 8B, and 8C show top views of another embodiment of the present invention, wherein the portions of the first inductor and the second inductor in the thicker top conductive layer comprise 1.5 windings, and wherein the voltage connections are made in the thinner underlying conductive layers.
Figure 8B:
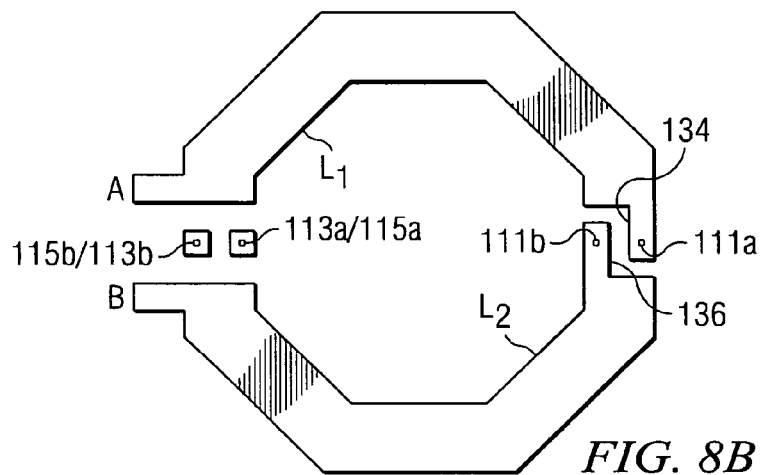
Figure 8C:
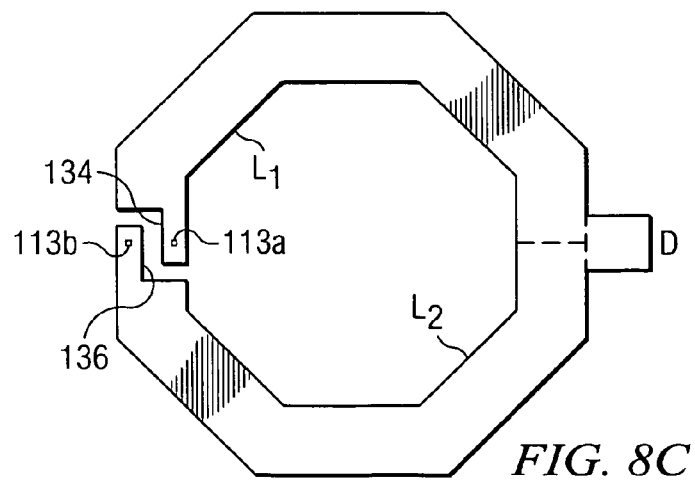

FIGS. 8A, 8B, and 8C show top views of another embodiment of the present invention, wherein the portions of the first inductor and the second inductor in the thicker top conductive layer comprise 1.5 windings, and wherein the voltage connections are made in the thinner underlying conductive layers. For example, the portions of the first and second inductor $L_1$ and $L_2$ in FIG. 8A comprise 1.5 windings that are preferably formed in a thicker conductive layer such as layer M6 shown in FIG. 3. The conductive layers shown in FIGS. 8B and 8C are preferably formed in layer M5 and M4, respectively, of FIG. 3, for example. This embodiment is advantageous because more and narrower windings may be made in the thicker upper conductive line layer.

Advantageously, the resistance of the conducting lines forming the portions of the first and second inductors $L_1$ and $L_2$ in adjacent conductive layers may be made equal, by adjusting the width of the windings and the number of windings to the thickness and conductance of the conductive material (e.g. thick vs. thin or Cu vs. Al), as examples. For example, a first conductive layer (such as conductive layer M6 in FIG. 3, shown in a top view in FIG. 8A) may comprise a first thickness and a first conductive material, and a second conductive layer (such as conductive layer M5 in FIG. 3, shown in a top view in FIG. 8B) may comprise a second thickness and a second conductive material, the second thickness being different than the first thickness. The first portion of the first inductor $L_1$ and the first portion of the second inductor $L_2$ in conductive layer M6 may comprise a first width and a first number of windings, and the second portion of the first inductor $L_1$ and the second portion of the second inductor $L_2$ in conductive layer M5 may comprise a second width and a second number of windings, the second width and the second number of windings being different than the first width and the first number of windings. Preferably, the resistance of the first conductive material forming the inductor portions $L_1$ and $L_2$ in conductive layer M6 is about equal to the resistance of the second conductive material forming the inductor portions $L_1$ and $L_2$ in the conductive layer M5, for example.

Note that in this embodiment, the portions of the first and second inductors $L_1$ and $L_2$ in the lower layers (FIGS. 8B and 8C comprise half windings, and the ends of the half-windings are notched (134, 146). Vias 111a and 111b provide electrical connection between the inductor portions in FIGS. 8A and 8B, and vias 113b/115b and 113a/115a provide electrical connection between the inductor portions in FIGS. 8C and 8A. In FIG. 8B, landing pads for vias 113a, 113b, 115a, and 115b are included in the conductive layer design to provide connection between the underlying vias 113a and 113b with the overlying vias 115a and 115b, respectively.

In some embodiments, the first inductor $L_1$ and the second inductor $L_2$ are preferably formed in exactly two conductive layers. In this embodiment, preferably, another conductive layer is used to connect the ends of the first inductor $L_1$ second portion and the second inductor $L_2$ second portion. For example, referring next to FIGS. 9A and 9B, the majority of the first and second inductors $L_1$ and $L_2$ are formed in the conductive layer shown in FIG. 9A, wherein the portions of the first and second inductors $L_1$ and $L_2$ comprise two windings. Vias 140a and 140b couple one end of the first and second inductors $L_1$ and $L_2$ to conductive lines 109a and 109b, respectively, which are coupled to voltage terminals A and B, respectively, as shown in FIG. 9B. Portions of the first and second inductors $L_1$ and $L_2$ in the conductive layer shown in FIG. 9B are coupled together and to a voltage supply terminal D. The portions of the first and second inductors $L_1$ and $L_2$ preferably include a notch 134 and 136, respectively, proximate the conductive line 109a and 109b ends, respectively, as shown, to create a symmetric connection structure for the coupled inductors $L_1$ and $L_2$.

Figure 9A:
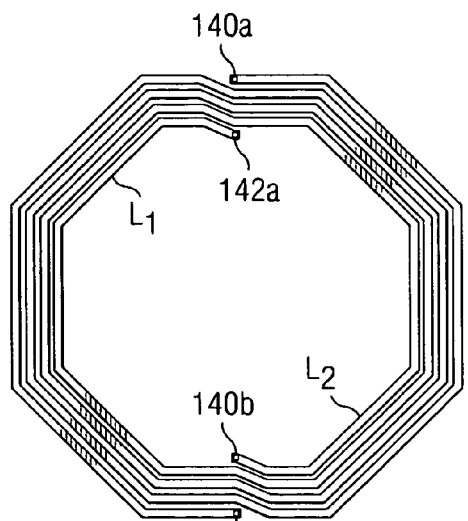
FIGS. 9A and 9B show top views of yet another embodiment of the present invention, wherein the first inductor, the second inductor, and the voltage connections are made within two conductive layers and the inductor portions comprise two windings in one layer.
Figure 9B:
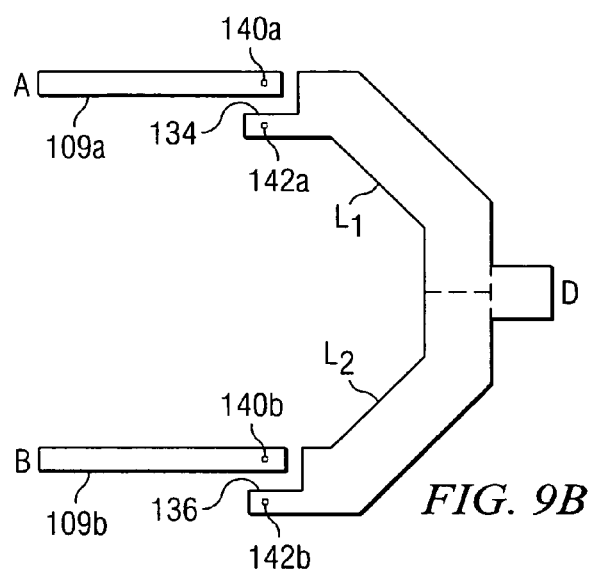
Figure 10A:
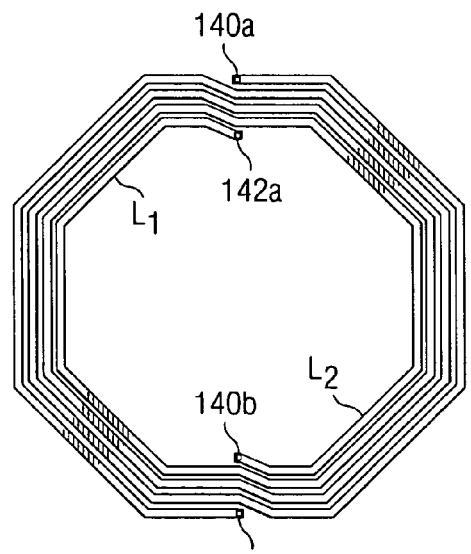
FIGS. 10A and 10B show an alternative embodiment to the embodiment shown in FIGS. 9A and 9B.
Figure 10B:
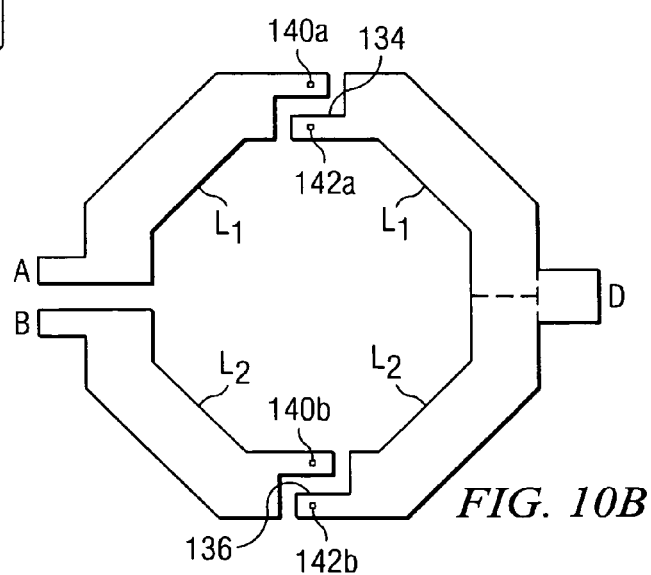

FIGS. 10A and 10B show an alternative embodiment to the embodiment shown in FIGS. 9A and 9B, wherein the voltage terminal A and B connections further comprise a portion of the first and second inductors $L_1$ and $L_2$. For example, the conductive lines 109a and 109b in FIG. 9B have been replaced with portions of first and second inductors $L_1$ and $L_2$, increasing the inductance. The ends of the portions of the first and second inductors $L_1$ and $L_2$ preferably comprise a notch to fit the notches 134 and 136 in the portions of the first and second inductors $L_1$ and $L_2$ coupled to the voltage supply terminal D, as shown.

Figure 11A:
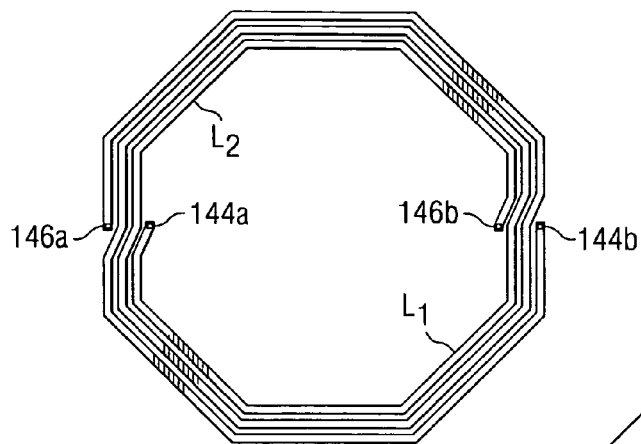
FIGS. 11A and 11B show another alternative embodiment to the embodiment shown in FIGS. 9A and 9B, wherein the inductor portions comprise 1.5 windings.
Figure 11B:
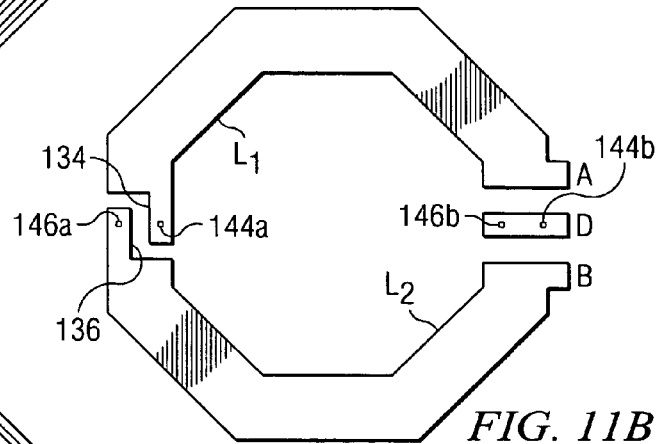

FIGS. 11A and 11B show another alternative embodiment to the embodiment shown in FIGS. 9A and 9B, wherein the inductor $L_1$ and $L_2$ portions comprise 1.5 windings in the top conductive layer, as shown in FIG. 11A. Vias 144a and 146a make electrical connection to the underlying portions of the first and second inductors $L_1$ and $L_2$, respectively, shown in FIG. 11B, which portions are coupled to the voltage terminals A and B, respectively. Vias 144b and 146b make electrical connection to the voltage supply terminal D, as shown.

Figure 12A:
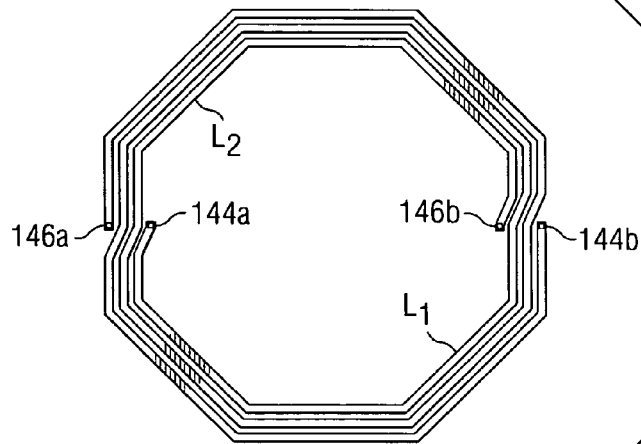
FIGS. 12A and 12B show another alternative embodiment to the embodiment shown in FIGS. 11A and 11B.
Figure 12B:
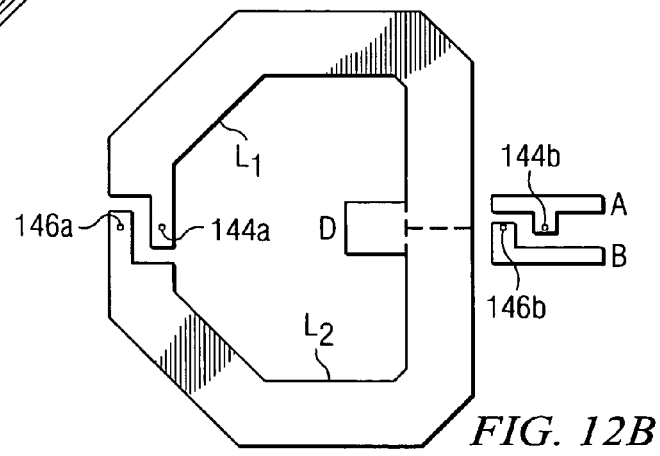

FIGS. 12A and 12B show another alternative embodiment to the embodiment shown in FIGS. 11A and 11B, wherein the connection for the voltage supply terminal D comprises portions of the first and second inductors $L_1$ and $L_2$.

Figure 13:
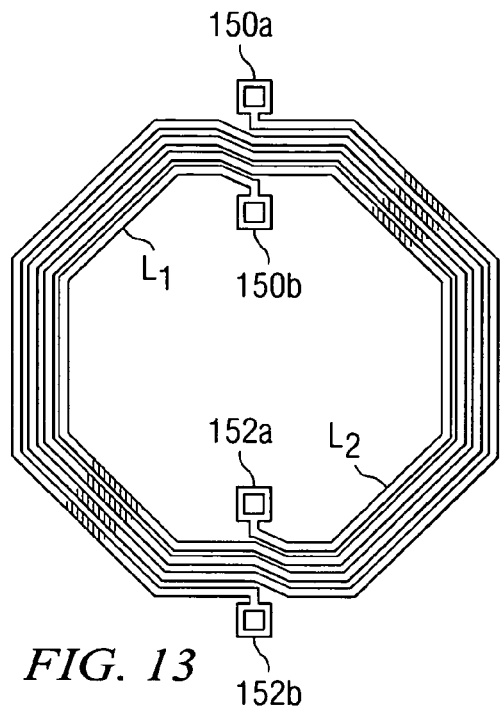
FIG. 13 illustrates that embodiments of the present invention are easily implementable in semiconductor designs having large vias.

FIG. 13 illustrates that embodiments of the present invention are easily implementable in semiconductor designs having large vias. The upper metallization layers of semiconductor devices often have large vias, compared to the line width of the windings of inductors, which can be problematic for some prior art inductor designs, because many crossings and vias are needed. Because the inductor $L_1$ and $L_2$ designs described herein use only two vias 150a, 150b, 152a, and 152b per winding at the inner and outer side of the windings, it is easy to combine large vias 150a, 150b, 152a, and 152b with narrow lines, e.g., narrow windings for the portions of the inductors $L_1$ and $L_2$ described herein, for example.

Figure 14:
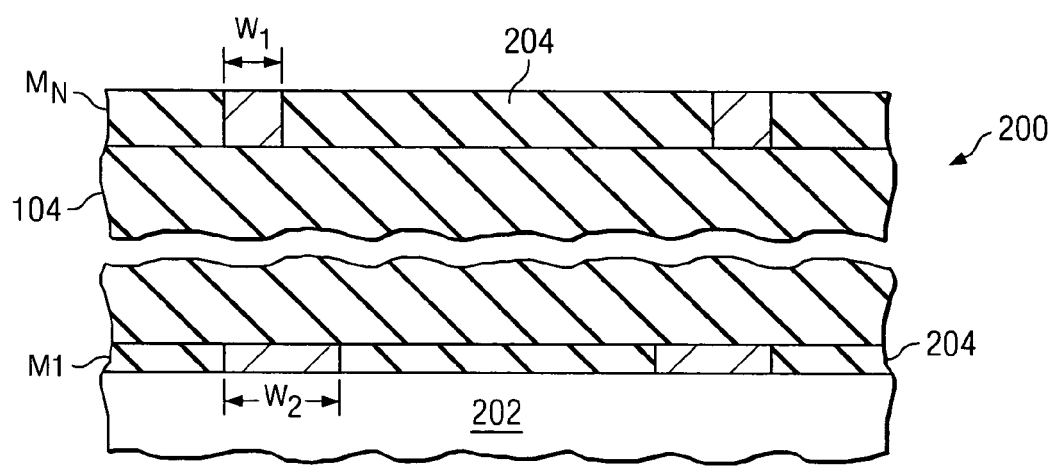
FIG. 14 shows a cross-sectional view of an embodiment of the present invention, wherein the windings of portions of the first inductor and the second inductor in the various conductive layers comprise different widths.

FIG. 14 shows a cross-sectional view of an embodiment of the present invention, wherein a semiconductor device 200 includes windings of portions of the first inductor and the second inductor in the various conductive layers having different widths. For example, if the upper conductive layer MN comprises a greater thickness than conductive layer M1, which is common in integrated circuits, advantageously, the portions of the inductors $L_1$ and $L_2$ may comprise a width $w_1$ that is less than the width $w_2$ of the portions of the inductors $L_1$ and $L_2$ in a lower conductive layer M1. The electrical properties such as resistance and inductance of the portions of the inductors $L_1$ and $L_2$ may be matched, between the conductive layers M1 and MN, by varying the width of the windings, for example. The use of wider conductive lines in the lower conductive levels (for example, providing a constant total cross-sectional area of the windings) may compensate for the reduced thickness of the lower conductive levels.

Figure 15:
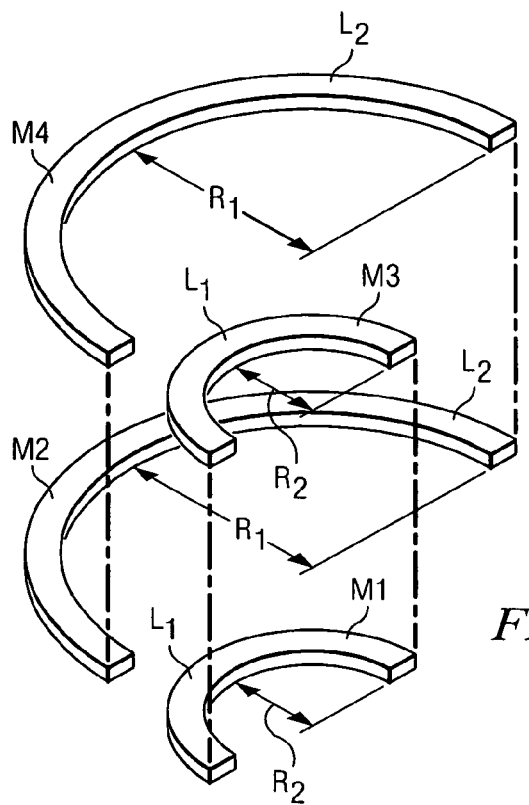
FIG. 15 shows a perspective view of multiple conductive layers of an embodiment of the present invention, wherein the windings of portions of the first inductor and second inductor in adjacent layers are staggered or offset.

FIG. 15 shows a perspective view of multiple conductive layers of an embodiment of the present invention, wherein the windings of portions of the first inductor and second inductor in adjacent layers are staggered or offset. The radius $R_1$ and $R_2$ of the windings in alternating layers may be varied so that the portions of the inductors $L_1$ and $L_2$ do not directly overlie one another in adjacent conductive layers, for example. Only the contact region where the ends of inductor portions are connected with vias, preferably have the same radius and position (not shown in the figure).

FIG. 16 illustrates a diagram for an ideal double-spherical shaped differential inductor $L_1$ and $L_2$ that may be manufactured in multiple conductive layers in accordance with embodiments of the present invention. By using multiple levels of interconnect to form the portions of the inductors $L_1$ and $L_2$, a coil-shaped structure can be achieved that is perfectly symmetrical and similar to an ideal differential inductor such as the one shown in FIG. 12, for example.

Figure 17A:
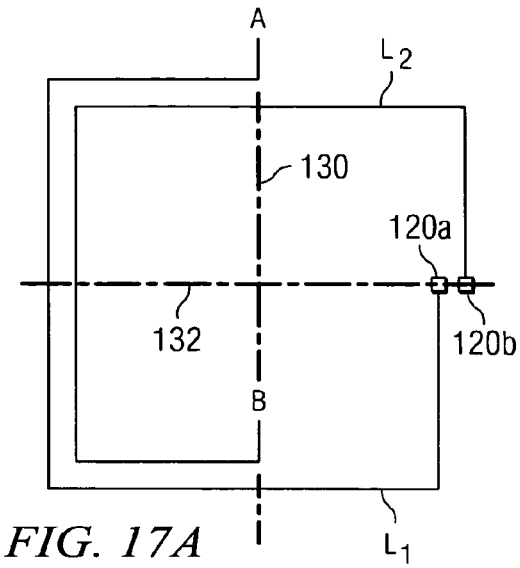
FIGS. 17A, 17B, and 17C show top views of another embodiment of the present invention, wherein the portions of the first inductor and the second inductor in each conductive layer comprise ¾ windings.
Figure 17B:
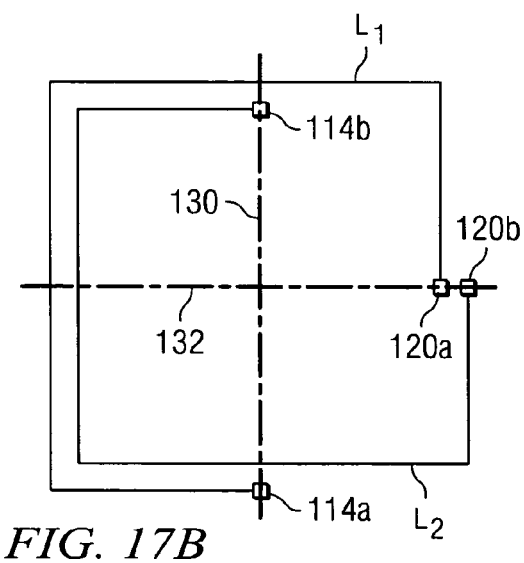
Figure 17C:
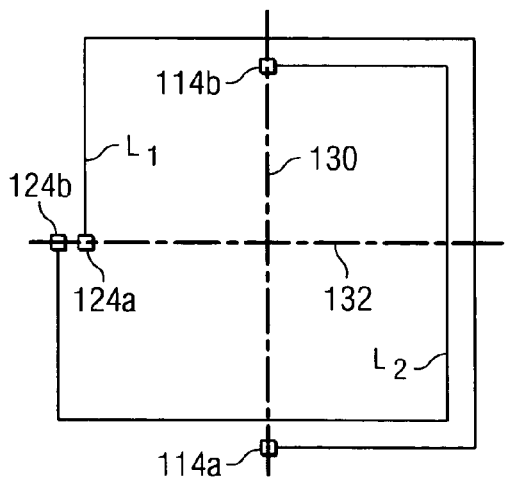

The portions of the first inductor $L_1$ and the second inductor $L_2$ described herein may comprise partial windings, single windings, or multiple windings. The portions of the first inductor $L_1$ and the second inductor $L_2$ may comprise a portion of a winding, a full winding, or more than one winding. For example, the portions of the inductors $L_1$ and $L_2$ may also comprise ¾ windings, as shown in FIGS. 17A, 17B, and 17C. In this embodiment, the voltage terminals A and B, and vias 114a and 114b, are positioned opposite one another, and vias 120a and 120b, and vias 124a and 124b, are positioned proximate one another, within the substantially loop-shaped structure of the first inductor $L_1$ and the second inductor $L_2$ portions. The voltage terminals A and B, and vias 114a and 114b, are positioned along a vertical axis 130, and vias 120a and 120b, and vias 124a and 124b, are positioned along a horizontal axis 132, as shown.

Advantageously, in some embodiments, because the via locations are alternated between an inner and outer radius of the windings, either partial windings, full windings, or multiple windings may be used for the portions of the inductors $L_1$ and $L_2$ in accordance with embodiments of the present invention. For example, the number of windings of the portions of the inductors $L_1$ and $L_2$ may comprise 0.5 windings, 0.75 windings, 1.0 winding, 1.5 windings, or 2.0 windings or greater. Other fractions of windings may alternatively be used, for example.

Preferably, in accordance with embodiments of the present invention, the portion of the second inductor $L_2$ formed in a conductive layer comprises a symmetric mirror image of the portion of the second inductor $L_1$ formed in that conductive layer. This may be achieved by rotating the pattern for the portion of the first inductor $L_1$ in that conductive layer by 180 degrees, for example, to obtain the pattern for the portion of the second inductor $L_2$ in that conductive layer.

Note that in some embodiments, subsequently formed portions of the inductors $L_1$ and $L_2$ may be formed beneath both the windings of the other portions of the inductors $L_1$ and $L_2$ in adjacent conductive layers, for example (e.g., such as in the embodiment shown in FIGS. 7A through 7C).

As another example, the pattern of the portion of the second inductor $L_2$ may comprise a symmetric mirror image of the portion of the first inductor $L_1$ in a conductive layer. For example, the portion of the second inductor $L_2$ in a conductive layer can be generated by mirroring the portion of the first inductor $L_1$ portion in an adjacent conductive layer.

Embodiments of the present invention may be implemented in various types of circuits of semiconductor devices. As an example, embodiments of the present invention may be implemented in the VCO circuit shown in FIG. 2. The differential inductor $L_1$ and $L_2$ of embodiments of the present invention may be utilized in place of the inductors $L_A$ and $L_B$ shown in FIG. 2. One end of each inductor $L_1$ and $L_2$ is coupled to a central tap D, which is connected to a voltage supply source $V_{DD}$. The other end of each inductor $L_1$ and $L_2$ is coupled to a variable capacitor C, at voltage terminals A and B, respectively, as shown. The circuit includes two transistors $X_1$ and $X_2$ and a current bias IBIAS that is coupled to ground. When a bias current IBIAS is applied, the circuit oscillates, creating a high frequency at voltage terminals $V_A$ and $V_B$.

Figure 18:
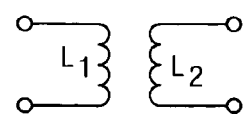

Embodiments of the present invention also have useful application in other circuits or applications where two coupled inductors $L_1$ and $L_2$ are required. For example, the inductors $L_1$ and $L_2$ described herein may be used in a transformer, as shown in FIG. 18.

Embodiments of the present invention include methods of manufacturing the inductors $L_1$ and $L_2$ described herein. Embodiments of the present invention also include integrated circuits, VCO circuits, transformers, and other semiconductor devices including the novel inductors $L_1$ and $L_2$ described herein.

An advantage of forming the windings of the inductors $L_1$ and $L_2$ primarily in one conductive layer, as shown in the embodiments of FIGS. 9A and 9B, 10A and 10B, 11A and 11B, and 12A and 12B, is that only two via connections $L_1$ and $L_2$ are required for each inductor; thus, the resistance of the inductor $L_1$ and $L_2$ structure is decreased.

Advantages of embodiments of the present invention include providing novel layout schemes for windings of differential inductors $L_1$ and $L_2$, wherein the windings of the inductors $L_1$ and $L_2$ may be formed in two or more conductive layers. The novel structures described herein allow the fabrication of a symmetrical differential inductor. In some embodiments, because the windings are distributed over different metal layers, it is possible to use the same winding diameter for each winding, resulting in an increased coupling ratio and increased inductivity.

In other embodiments, the windings of the inductors $L_1$ and $L_2$ are preferably arranged in such a way that the middle tap D of a VCO circuit is preferably located in the lowest metal layer, and thus has the highest parasitic capacitance, while the sensitive voltage input terminals (A and B) are preferably positioned within the highest metal layer, thus experiencing the lowest parasitic capacitance within the structure.

Embodiments of the present invention result in the fabrication of differential inductors $L_1$ and $L_2$ having optimized inductivity, parasitic capacitance, and series resistance. The width of the portions of the inductors $L_1$ and $L_2$ may be altered to optimize the structure, e.g., by using wider lines for thinner conductive layers. The radius (or diameter) of neighboring layers may be altered to reduce capacitive coupling between the conductive layers, e.g., by alternating winding diameters.

The structure may further be optimized by altering the number of windings in the layers, e.g., one conductive layer may have a first number of windings or portions of windings, and another conductive layer may have a second number of windings or portion or windings, wherein the second number is different from the first number.

Embodiments of the present invention provide a differential inductor design having a high degree of symmetry. The layout for the second inductor $L_2$ portions within each conductive layer may be generated by rotating the first inductor $L_1$ portion designs by 180°, for example. In the embodiments wherein the portions comprise substantially the same shape in each conductive layer, adjacent conductive line layer layouts may be generated by mirroring the layout for the previous adjacent layer, for example.

The differential inductors $L_1$ and $L_2$ described herein having improved symmetry result in improved performance of differential circuits, for example. Improved electromagnetic symmetry from the differential inputs A and B to a center tap D is achieved by the differential inductors $L_1$ and $L_2$ described herein.

Preferably the vias between the portions of the first inductor to portions of the first inductor in adjacent layers are alternated between locations at an inner and outer radius of the portions of the first inductor in each successive conductive layer, and the second inductor vias between the portions of the second inductor to portions of the second inductor in adjacent layers are also alternated between locations at an inner and outer radius of the portions of the second inductor in each successive conductive layer. The novel alternating between inner and outer radiuses of the inductor portions advantageously enables the use of three or more conductive layers for the formation of the first and second inductors $L_1$ and $L_2$. Thus, the inductors $L_1$ and $L_2$ may be formed within three or more conductive layers, e.g., 8 or more, conductive layers of an integrated circuit. As the number of windings increase, the value of the inductance of the inductors $L_1$ and $L_2$ advantageously increases.

Note that the windings of the portions of the inductors $L_1$ and $L_2$ are shown in the figures as having 45 degree or 90 degree bends; alternatively, the windings of the portions of the inductors $L_1$ and $L_2$ may comprise other shapes, such as curved sections of conductive material or conductive material patterned at other angles, for example.

Advantages of preferred embodiments of the present invention include providing pairs of coupled inductors wherein the two inductors have very symmetric inductance, resistance, and capacitance values. Differential inductors with increased inductance may be achieved by utilizing a greater number of conductive layers of integrated circuits, and by increasing the number of windings of the portions of the inductors within one or more conductive layers. Asymmetry of the two inductors is minimized by via positioning, using appropriate layouts, and by the use of notches at the end of the inductor portions for accommodating the via positioning to achieve increased symmetry.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor device, comprising:
   a workpiece;
   a first conductive layer disposed over the workpiece, a first continuous portion of a first inductor and a first continuous portion of a second inductor being disposed within the first conductive layer, the first continuous portion of the second inductor, including connection structures, being symmetric to the first continuous portion of the first inductor, including connection structure, said first continuous portion of said first inductor being the only portion of said first inductor in said first conductive layer and said first continuous portion of said second inductor being the only portion of said second inductor in said first conductive layer;

at least one second conductive layer disposed proximate the first conductive layer, a second portion of the first inductor and a second portion of the second inductor being disposed within said at least one second conductive layer, each second portion of the second inductor being symmetric to each second portion of the first inductor within each at least one second conductive layer;

at least one first inductor via coupling the first continuous portion of the first inductor in the first conductive layer to the second portion of the first inductor in an adjacent second conductive layer; and at least one second inductor via coupling the first continuous portion of the second inductor in the first conductive layer to the second portion of the second inductor in the adjacent second conductive layer, wherein the at least one second inductor via is symmetric to the at least one first inductor via.

2. The semiconductor device according to claim 1, wherein the first portion and the at least one second portion of the first inductor comprise a first inductor of a differential inductor or a transformer, and wherein the first portion and the at least one second portion of the second inductor comprise a second inductor of a differential inductor or a transformer.

3. The semiconductor device according to claim 1, wherein the first portion of the first inductor and the first portion of the second inductor comprise a substantially loop-shaped structure, wherein the at least one second inductor via is positioned on the substantially loop-shaped structure 0 degrees or 180 degrees with respect to the at least one first inductor via.

4. The semiconductor device according to claim 1, wherein the first portion of the first inductor and the first portion of the second portion comprise a substantially loop-shaped structure, wherein the first portion of the first inductor comprises a first notch at least one end of the first portion of the first inductor, wherein the first portion of the second inductor comprises a second notch at least one end of the first portion of the second inductor, wherein the at least one first inductor via is coupled to the first notch, wherein the at least one second inductor via is coupled to the second notch.

5. The semiconductor device according to claim 4, wherein the first notch is outwardly facing from the substantially loop-shaped structure and wherein the second notch is inwardly facing from the substantially loop-shaped structure, or wherein the first notch is inwardly facing from the substantially loop-shaped structure and wherein the second notch is outwardly facing from the substantially loop-shaped structure.

6. The semiconductor device according to claim 1, wherein:
a second portion of the first inductor is disposed within a second conductive layer adjacent to the first conductive layer proximate the first portion of the second inductor in the first conductive layer; and
a second portion of the second inductor is disposed within the second conductive layer adjacent to the first conductive layer proximate the first portion of the first inductor in the first conductive layer.

7. The semiconductor device according to claim 1, wherein the at least one first inductor via between the portions of the first inductor to portions of the first inductor in adjacent conductive layers is alternated between locations at an inner and outer radius of the portions of the first inductor in each successive conductive layer, and wherein the at least one second inductor vias between the portions of the second inductor to portions of the second inductor in adjacent conductive layers is alternated between locations at an inner and outer radius of the portions of the second inductor in each successive conductive layer.

8. The semiconductor device according to claim 1, wherein the at least one first inductor via and the at least one second inductor via are aligned on a straight line.

9. The semiconductor device according to claim 1, wherein the first portion of the first inductor and the first portion of the second inductor comprise a substantially loop-shaped structure, wherein the first inductor vias between the portions of the first inductor to portions of the first inductor in adjacent conductive layers are located proximate, or opposed from, the second inductor vias between the portions of the second inductor to portions of the second inductor in adjacent conductive layers, along the substantially loop-shaped structure.

10. The semiconductor device according to claim 1, wherein:
a third portion of the first inductor is formed in a third conductive layer disposed proximate the at least one second conductive layer; and
a third portion of the second inductor is formed in the third conductive layer, the third portion of the second inductor being symmetric to the third portion of the first inductor.

11. The semiconductor device according to claim 10, wherein:
the first portion of the first inductor comprises a first end and a second end;
the first portion of the second inductor comprises a first end and a second end, the first end of the first portion of the second inductor being proximate the first end of the first portion of the first inductor, the second end of the first portion of the second inductor being proximate the second end of the first portion of the first inductor;
the second portion of the first inductor comprises a first end and a second end, the first end of the second portion of the first inductor being coupled to the first end of the first portion of the first inductor;
the second portion of the second inductor comprises a first end and a second end, the first end of the second portion of the second inductor being proximate the first end of the second portion of the first inductor, the second end of the second portion of the second inductor being proximate the second end of the second portion of the first inductor, the second end of the second portion of the second inductor being coupled to the second end of the first portion of the second inductor;
the third portion of the first inductor comprises a first end and a second end, the second end of the third portion of the first inductor being coupled to the second end of the second portion of the first inductor; and
the third portion of the second inductor comprises a first end and a second end, the first end of the third portion of the second inductor being proximate the first end of the third portion of the first inductor, the second end of the third portion of the second inductor being proximate the second end of the third portion of the first inductor, the first end of the third portion of the second inductor being coupled to a first end of the first portion of the second inductor.

12. The semiconductor device according to claim 11, wherein a first voltage terminal is coupled to the second end of the first portion of the first inductor, and wherein a second voltage terminal is coupled to the first end of the first portion of the second inductor.

13. The semiconductor device according to claim 12, further comprising a fourth conductive layer disposed over the workpiece, wherein the third portion of the first inductor and the third portion of the second inductor are coupled together by a portion of the fourth conductive layer, and wherein the portion of the fourth conductive layer is coupled to a voltage supply terminal.

14. The semiconductor device according to claim 11, further comprising a fourth conductive layer disposed over the workpiece, wherein a fourth portion of the first inductor and a fourth portion of the second inductor are disposed within the fourth conductive layer.

15. The semiconductor device according to claim 14, wherein the fourth portion of the first inductor comprises a first end and a second end, wherein the fourth portion of the second inductor comprises a first end and a second end, wherein the first end of the fourth portion of the first inductor is coupled to the first end of the third portion of the first inductor, wherein the second end of the fourth portion of the second inductor is coupled to the second end of the third portion of the second inductor.

16. The semiconductor device according to claim 15, wherein the second end of the first inductor and the first end of the second inductor are coupled together by a portion of the fourth conductive layer, and wherein the portion of the fourth conductive layer is coupled to a voltage supply terminal.

17. The semiconductor device according to claim 1, wherein:
the at least one first via is coupled at a location at an outer radius of the second portion of the first inductor and at a location at an outer radius of the first portion of the first inductor; and
the at least one second via is coupled at a location at an inner radius of the second portion of the second inductor and at a location at an inner radius of the first portion of the second inductor.

18. The semiconductor device according to claim 1, wherein the first conductive layer comprises a top-most conductive level of an integrated circuit, wherein the first conductive layer comprises a greater thickness than the thickness of at least the second conductive layer, wherein the first portion of the first inductor and the first portion of the second inductor comprise a first width, and wherein the second portion of the first inductor and the second portion of the second inductor comprise a second width, the second width being greater than the first width.

19. The semiconductor device according to claim 1, wherein:
the second portion of the first inductor is disposed within the second conductive layer beneath the first portion of the second inductor in the first conductive layer; and
the second portion of the second inductor is disposed within the second conductive layer beneath the first portion of the first inductor in the first conductive layer.

20. The semiconductor device according to claim 1, wherein:
the second portion of the first inductor is disposed within the second conductive layer proximate yet offset from the first portion of the second inductor in the first conductive layer; and
the second portion of the second inductor is disposed within the second conductive layer proximate yet offset from the first portion of the first inductor in the first conductive layer.

21. The semiconductor device according to claim 1, wherein the first portion of the first inductor and the first portion of the second inductor comprise a first number of windings or portions of windings, wherein the second portion of the first inductor and the second portion of the second inductor comprise a first number of windings or portions of windings, and wherein the first number of windings or portions of windings and the second number of windings or portions of windings are equal or different.

22. The semiconductor device according to claim 21, wherein the first conductive layer has a greater thickness than at least the second conductive layer, wherein the second number of windings or portions of windings is greater than the first number of windings or portions of windings, wherein the first portion of the first inductor comprises substantially the same resistance as the second portion of the first inductor, and wherein the first portion of the second inductor comprises substantially the same resistance as the second portion of the second inductor.

23. The semiconductor device according to claim 21, wherein the first number of windings or portions of windings and the second number of windings or portions of windings comprise 0.5 windings, 0.75 windings, 1.0 winding, 1.25, or 1.5 windings, 1.75 or 2.0 windings or greater.

24. The semiconductor device according to claim 1, wherein the first inductor substantially comprises a shape of a first spiral, and wherein the second inductor substantially comprises a shape of a second spiral, the second spiral being a mirror image of the first spiral.

25. The semiconductor device according to claim 1, wherein one or more portions of the first inductor and the corresponding portion of the second inductor comprise two ends, wherein the ends of the portions of the first inductor and the second inductor include a notch so that the adjacent ends of the portions of the first inductor and the portions of the second inductor portion are staggered, and wherein the plurality of first inductor vias and the plurality of second inductor vias are coupled at the notched ends of the portions of the first inductor and the portions of the second inductor.

26. The semiconductor device according to claim 25, wherein the portions of the first inductor and the portions of the second inductor comprise x.f windings, wherein x comprises a whole number such as 0, 1, 2, 3, etc. and wherein f comprises a fraction of a winding.

27. The semiconductor device according to claim 1, wherein one conductive layer comprises a portion of an inductor comprising x windings, wherein x is a whole number, and every other conductive layer comprises x windings.

28. The semiconductor device according to claim 1, wherein the first portion of the second inductor comprises a pattern of the first portion of the first inductor rotated by about 180 degrees.

29. The semiconductor device according to claim 1, wherein the second portion of the second inductor comprises a mirror image of the first portion of the first inductor.

30. The semiconductor device according to claim 1, wherein the first conductive layer comprises a first thickness and a first conductive material, wherein the at least one second conductive layer comprises a second thickness and a second conductive material, the second thickness being different than the first thickness, wherein the first portion of the first inductor and the first portion of the second inductor comprise a first width and a first number of windings, wherein the second portion of the first inductor and the second portion of the second inductor comprise a second width and a second number of windings, the second width and the second number of windings being different than the first width and the first number of windings, and wherein the resistance of the first conductive material forming the inductor portions in the first conductive layer is about equal to the resistance of the second conductive material forming the inductor portions in the at least one second conductive layer.

31. A voltage control oscillator (VCO) or a transformer including the semiconductor device according to claim 1.

32. An integrated circuit including the semiconductor device according to claim 1.

33. A method of manufacturing a semiconductor device, the method comprising:

provide a workpiece;

forming a first conductive layer over the workpiece;

forming at least one second conductive layer proximate the first conductive layer;

forming a first continuous portion of a first inductor and a first continuous portion of a second inductor within the first conductive layer, the first continuous portion, including connection structures, of the first inductor and the first continuous portion, including connection structures, of the second inductor being symmetric, said first continuous portion of said first inductor being the only portion of said first inductor in said first conductive layer and said first continuous portion of said second inductor being the only portion of said second inductor in said first conductive layer;

forming a second portion of the first inductor and a second portion of the second inductor within each at least one second conductive layer, each second portion of the first inductor and each second portion of the second inductor being symmetric within each at least one second conductive layer;

coupling the first continuous portion of the first inductor in the first conductive layer to the second portion of the first inductor in an adjacent second conductive layer with at least one first inductor via; and coupling the first continuous portion of the second inductor in the first conductive layer to the second portion of the second inductor with at least one second inductor via in the adjacent second conductive layer, wherein the at least one first inductor via and the at least one second inductor via are symmetric.

34. The method according to claim 33, wherein forming the first portion and forming the at least one second portion of the first inductor comprise forming a first inductor of a differential inductor or a transformer, and wherein forming the first portion and forming the at least one second portion of the second inductor comprise forming a second inductor of a differential inductor or a transformer.

35. The method according to claim 33, wherein the first portion of the first inductor and the first portion of the second portion comprise a substantially loop-shaped structure, wherein the at least one second inductor via is positioned on the substantially loop-shaped structure 0 degrees or 180 degrees with respect to the at least one first inductor via.

36. The method according to claim 33, wherein the first portion of the first inductor and the first portion of the second portion comprise a substantially loop-shaped structure, wherein forming the first portion of the first inductor comprises forming a first notch at the at least one end of the first portion of the first inductor, wherein forming the first portion of the second inductor comprises forming a second notch at the at least one end of the first portion of the second inductor, and wherein the at least one first inductor via is coupled to the first notch, wherein the at least one second inductor via is coupled to the second notch.

37. The semiconductor device of claim 1 wherein said first continuous portion of said first inductor does not physically pass over or under said first continuous portion of said second inductor.

38. The method of claim 33 wherein said first continuous portion of said first inductor does not physically pass over or under said first continuous portion of said second inductor.

* * * * *